United States Patent
Lai et al.

(10) Patent No.: US 8,987,700 B2
(45) Date of Patent: Mar. 24, 2015

(54) THERMALLY CONFINED ELECTRODE FOR PROGRAMMABLE RESISTANCE MEMORY

(75) Inventors: Sheng-Chih Lai, Elmsford, NY (US); Hsiang-Lan Lung, Ardsley, NY (US); Matthew J. Breitwisch, Pound Ridge, NY (US)

(73) Assignee: Macronix International Co., Ltd., Hsinchu (TW)

( * ) Notice: Subject to any disclaimer, the term of this patent is extended or adjusted under 35 U.S.C. 154(b) by 300 days.

(21) Appl. No.: 13/310,583

(22) Filed: Dec. 2, 2011

(65) Prior Publication Data

US 2013/0140513 A1 Jun. 6, 2013

(51) Int. Cl.
*H01L 47/00* (2006.01)
*H01L 45/00* (2006.01)
*H01L 27/24* (2006.01)

(52) U.S. Cl.
CPC ............ *H01L 45/06* (2013.01); *H01L 45/1233* (2013.01); *H01L 45/126* (2013.01); *H01L 27/2463* (2013.01)
USPC ...................................... 257/4; 257/E45.002

(58) Field of Classification Search
CPC ..... H01L 45/124; H01L 45/126; H01L 45/06; H01L 45/1233; H01L 45/16; H01L 27/2463; H01L 27/2472; H01L 45/1683; H01L 45/141; H01L 45/144
USPC .............................................. 257/4, E45.002
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,452,592 A | 6/1984 | Tsai | |
| 4,599,705 A | 7/1986 | Holmberg et al. | |
| 4,719,594 A | 1/1988 | Young et al. | |

(Continued)

FOREIGN PATENT DOCUMENTS

| TW | 250617 B | 3/2006 |
|---|---|---|
| WO | 0079539 A1 | 12/2000 |

(Continued)

OTHER PUBLICATIONS

Bez, R., "Chalcogenide PCM: a Memory Technology for Next Decade," Electron Devices Meeting (IEDM), 2009 IEEE International, pp. 1-4.

(Continued)

*Primary Examiner* — Ermias Woldegeorgis
(74) *Attorney, Agent, or Firm* — Haynes Beffel & Wolfeld LLP

(57) ABSTRACT

A memory device includes a plurality of side-wall electrodes formed on a first side-wall of a trench within an insulating layer over a first plurality of contacts in an array of contacts in a substrate. The plurality of side-wall electrodes contact respective top surfaces of the first plurality of contacts. The side-wall electrodes respectively comprise a layer of tantalum nitride, having a composition $Ta_xN_y$, where y is greater than x, and a layer of electrode material having a lower electrical resistivity and a lower thermal resistivity than the layer of tantalum nitride. Top surfaces of the plurality of side-wall electrodes contact memory material. A second plurality of side-wall electrodes may be formed on a second side-wall of the trench over a second plurality of contacts in the array of contacts.

21 Claims, 16 Drawing Sheets

(56) References Cited

U.S. PATENT DOCUMENTS

| | | |
|---|---|---|
| 4,769,339 A | 9/1988 | Ishii |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi |
| 5,389,566 A | 2/1995 | Lage |
| 5,391,901 A | 2/1995 | Tanabe |
| 5,515,488 A | 5/1996 | Hoppe et al. |
| 5,534,712 A | 7/1996 | Ovshinsky et al. |
| 5,550,396 A | 8/1996 | Tsutsumi |
| 5,687,112 A | 11/1997 | Ovshinsky |
| 5,688,713 A | 11/1997 | Linliu et al. |
| 5,716,883 A | 2/1998 | Tseng |
| 5,751,012 A | 5/1998 | Wolstenholme et al. |
| 5,754,472 A | 5/1998 | Sim |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji |
| 6,066,870 A | 5/2000 | Siek |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,507,061 B1 | 1/2003 | Hudgens et al. |
| 6,511,867 B2 | 1/2003 | Lowrey et al. |
| 6,512,241 B1 | 1/2003 | Lai |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda |
| 6,555,858 B1 | 4/2003 | Jones et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,744,088 B1 | 6/2004 | Dennison |
| 6,750,079 B2 | 6/2004 | Lowrey et al. |
| 6,750,101 B2 | 6/2004 | Lung |
| 6,791,102 B2 | 9/2004 | Johnson et al. |
| 6,797,979 B2 | 9/2004 | Chiang et al. |
| 6,805,563 B2 | 10/2004 | Ohashi |
| 6,815,704 B1 | 11/2004 | Chen |
| 6,838,692 B1 | 1/2005 | Lung |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,897,467 B2 | 5/2005 | Doan et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg |
| 6,992,932 B2 | 1/2006 | Cohen |
| 7,018,911 B2 | 3/2006 | Lee et al. |
| 7,023,009 B2 | 4/2006 | Kostylev et al. |
| 7,033,856 B2 | 4/2006 | Lung |
| 7,038,230 B2 | 5/2006 | Chen et al. |
| 7,038,938 B2 | 5/2006 | Kang |
| 7,042,001 B2 | 5/2006 | Kim et al. |
| 7,067,864 B2 | 6/2006 | Nishida et al. |
| 7,067,865 B2 | 6/2006 | Lung |
| 7,078,273 B2 | 7/2006 | Matsuoka et al. |
| 7,115,927 B2 | 10/2006 | Hideki et al. |
| 7,122,281 B2 | 10/2006 | Pierrat |
| 7,122,824 B2 | 10/2006 | Khouri et al. |

(56) References Cited

U.S. PATENT DOCUMENTS

| | | |
|---|---|---|
| 7,126,149 B2 | 10/2006 | Iwasaki et al. |
| 7,132,675 B2 | 11/2006 | Gilton |
| 7,154,774 B2 | 12/2006 | Bedeschi et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung |
| 7,208,751 B2 | 4/2007 | Ooishi |
| 7,214,958 B2 | 5/2007 | Happ |
| 7,220,983 B2 | 5/2007 | Lung |
| 7,229,883 B2 | 6/2007 | Wang et al. |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,269,052 B2 | 9/2007 | Segal et al. |
| 7,277,317 B2 | 10/2007 | Le Phan |
| 7,291,556 B2 | 11/2007 | Choi et al. |
| 7,309,630 B2 | 12/2007 | Fan et al. |
| 7,321,130 B2 | 1/2008 | Lung et al. |
| 7,323,708 B2 | 1/2008 | Lee et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung |
| 7,365,385 B2 | 4/2008 | Abbott |
| 7,379,328 B2 | 5/2008 | Osada et al. |
| 7,385,235 B2 | 6/2008 | Lung |
| 7,394,088 B2 | 7/2008 | Lung |
| 7,394,089 B2 | 7/2008 | Doyle et al. |
| 7,397,060 B2 | 7/2008 | Lung |
| 7,423,300 B2 | 9/2008 | Lung et al. |
| 7,426,134 B2 | 9/2008 | Happ et al. |
| 7,485,891 B2 | 2/2009 | Hamann et al. |
| 7,504,653 B2 | 3/2009 | Lung |
| 7,560,337 B2 | 7/2009 | Ho et al. |
| 7,579,613 B2 | 8/2009 | Lung et al. |
| 7,606,059 B2 | 10/2009 | Toda |
| 7,623,370 B2 | 11/2009 | Toda et al. |
| 7,778,063 B2 | 8/2010 | Brubaker et al. |
| 7,804,083 B2 | 9/2010 | Chen |
| 7,868,313 B2 | 1/2011 | Breitwisch et al. |
| 8,048,755 B2 | 11/2011 | Sandhu et al. |
| 8,084,842 B2 | 12/2011 | Chen |
| 2002/0042158 A1 | 4/2002 | Kersch et al. |
| 2002/0070457 A1 | 6/2002 | Sun et al. |
| 2002/0074658 A1* | 6/2002 | Chiang ............ 257/750 |
| 2002/0113273 A1 | 8/2002 | Hwang et al. |
| 2003/0003647 A1 | 1/2003 | Dennison et al. |
| 2003/0072195 A1 | 4/2003 | Mikolajick |
| 2003/0095426 A1 | 5/2003 | Hush et al. |
| 2003/0186481 A1 | 10/2003 | Lung |
| 2003/0215978 A1 | 11/2003 | Maimon et al. |
| 2004/0026686 A1 | 2/2004 | Lung |
| 2004/0051094 A1 | 3/2004 | Ooishi |
| 2004/0114317 A1 | 6/2004 | Chiang et al. |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0019975 A1 | 1/2005 | Lee et al. |
| 2005/0029502 A1 | 2/2005 | Hudgens |
| 2005/0062087 A1 | 3/2005 | Chen et al. |
| 2005/0093022 A1 | 5/2005 | Lung |
| 2005/0127347 A1 | 6/2005 | Choi et al. |
| 2005/0127349 A1 | 6/2005 | Horak et al. |
| 2005/0145984 A1 | 7/2005 | Chen et al. |
| 2005/0191804 A1 | 9/2005 | Lai et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2006/0001174 A1 | 1/2006 | Matsui |
| 2006/0003263 A1 | 1/2006 | Chang |
| 2006/0006472 A1 | 1/2006 | Jiang |
| 2006/0024950 A1* | 2/2006 | Choi et al. ............ 438/626 |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0077741 A1 | 4/2006 | Wang et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157681 A1 | 7/2006 | Chen et al. |
| 2006/0175596 A1 | 8/2006 | Happ et al. |
| 2006/0198183 A1 | 9/2006 | Kawahara et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289848 A1 | 12/2006 | Dennison |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0045605 A1 | 3/2007 | Hsueh |
| 2007/0045606 A1 | 3/2007 | Magistretti et al. |
| 2007/0096162 A1 | 5/2007 | Happ et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235710 A1 | 10/2007 | Matsuzaki et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0246782 A1 | 10/2007 | Philipp et al. |
| 2007/0249090 A1 | 10/2007 | Philipp et al. |
| 2007/0257300 A1 | 11/2007 | Ho et al. |
| 2007/0262388 A1 | 11/2007 | Ho et al. |
| 2007/0274121 A1 | 11/2007 | Lung et al. |

(56) References Cited

U.S. PATENT DOCUMENTS

| | | |
|---|---|---|
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0019170 A1 | 1/2008 | Happ et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0116441 A1 | 5/2008 | Raghuram et al. |
| 2008/0137400 A1 | 6/2008 | Chen et al. |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2009/0032794 A1 | 2/2009 | Hsiao |
| 2009/0148980 A1 | 6/2009 | Yu |
| 2009/0298223 A1 | 12/2009 | Cheek et al. |
| 2010/0193763 A1 | 8/2010 | Chen et al. |
| 2010/0291747 A1 | 11/2010 | Lung et al. |
| 2011/0034003 A1 | 2/2011 | Lung |
| 2012/0020140 A1 | 1/2012 | Chen |

FOREIGN PATENT DOCUMENTS

| | | | |
|---|---|---|---|
| WO | 0145108 A1 | 6/2001 | |
| WO | 0225733 A2 | 3/2002 | |

OTHER PUBLICATIONS

"Magnetic Bit Boost," www.sciencenews.org, Dec. 18 & 25, 2004, p. 389, vol. 166.
"New Memories Tap Spin, Gird for Battle," Science News, Apr. 3, 1999, p. 223, vol. 155.
"Optimized Thermal Capacitance in a Phase Change Memory Cell Design," IPCOM000141986D, IP.com Prior Art Database, Oct. 18, 2006, 4pp.
"Remembering on the Cheap," www.sciencenews.org, Mar. 19, 2005, p. 189, vol. 167.
"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.
Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM Dec. 13-15, 2004, pp. 907-910.
Ahn, S. J. et al., "Highly Reliable 50nm Contact Cell Technology for 256Mb PRAM," VLSI Technology, Digest of Technical Papers, Jun. 14-16, 2005, pp. 98-99.
Atwood, G, et al., "90 nm Phase Change Technology with u Trench and Lance Cell Elements," VLSI Technology, Systems and Applications, Apr. 23-25, 2007, pp. 1-2.
Axon Technologies Corporation paper: Technology Description, published in 1997, pp. 1-6.
Bedeschi, F. et al., "4-MB MOSFET-Selected Phase-Change Memory Experimental Chip," IEEE, Sep. 21 to 23, 2004, 4 PP.
Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.
Chen, AN et al., "Non-Volatile Resistive Switching for Advanced Memory Applications," IEEE IEDM, Dec. 5-7, 2005, 4 pp.
Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.
Gibson, G. A. et al., "Phase-change Recording Medium that Enables Ultrahigh-density Electron-beam Data Storage," Applied Physics Letter, 2005, 3 pp., vol. 86.
Gill, Manzur et al., "A High-Performance Nonvolatile Memory Technology for Stand-Alone Memory and Embedded Applications," 2002 IEEE-ISSCC Technical Digest (TD 12.4), 7 pp.
Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.
Happ, T. D. et al., "Novel One-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.
Horii, H. et al., "A Novel Cell Technology Using N-doped GeSbTe Films for Phase Change RAM," Jun. 10-12, 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.
Kim, Kinam et al., "Reliability Investigations for Manufacturable High Density PRAM," IEEE 43rd Annual International Reliability Physics Symposium, San Jose, Apr. 17-21, 2005, pp. 157-162.
Kojima, Rie et al., "Ge-Sn-Sb-Te Phase-change Recording Material Having High Crystallization Speed," Proceedings of PCOS 2000, pp. 36-41.
Lacita, A. L., "Electrothermal and Phase-change Dynamics in Chalcogenide-based Memories," IEEE IEDM Dec. 13-15, 2004, 4 pp.
Lai, Stefan, "Current Status of the Phase Change Memory and Its Future," IEEE IEDM Dec. 10, 2003, pp. 255-258.
Lai, Stefan et al., "OUM-A 180 nm Nonvolatile Memory Cell Element Technology for Stand Alone and Embedded Applications," IEEE IEDM Dec. 2-5, 2001, pp. 803-806.
Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.
Mott, Nevill, "Electrons in Glass," Nobel Lecture, Dec. 8, 1977, Physics, 1977, pp. 403-413.
Ovonyx Non-Confidential paper entitled "Ovonic Unified Memory," Dec. 1999, pp. 1-80.
Ovshinsky, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.
Pellizer, F. et al.,"Novel u Trench Phase—Change Memory Cell for Embedded and Stand-Alone Non-Volatile Memory Applications," Jun. 15-17, 2004 Symposium on VLSI Technology Digest of Technical Papers, pp. 18-19.

(56) References Cited

OTHER PUBLICATIONS

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE Jun. 4-7, 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE Mar. 18-25, 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P. PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM Dec. 10, 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Sadeghipour S.M., et al., "Phase change random access memory, thermal analysis," Thermal and Thermomechanical Phenomena in Electronics Systems, ITHERM '06, 10th Intersociety Conf., 2006, pp. 660-665.

U.S. Appl. No. 13/089,934, filed Apr. 19, 2011 for Sidewall Thin Film Electrode With Self-Aligned Top Electrode and Programmable Resistance Memory, by H-L Lung.

U.S. Appl. No. 13/191,490, filed Jul. 27, 2011 for Phase Change Memory Electrode with Sheath for Reduced Programming Current, by M.J. Breitwisch.

Chinese Office Action for Application No. 201210098457.1 dated Jun. 17, 2014.

* cited by examiner

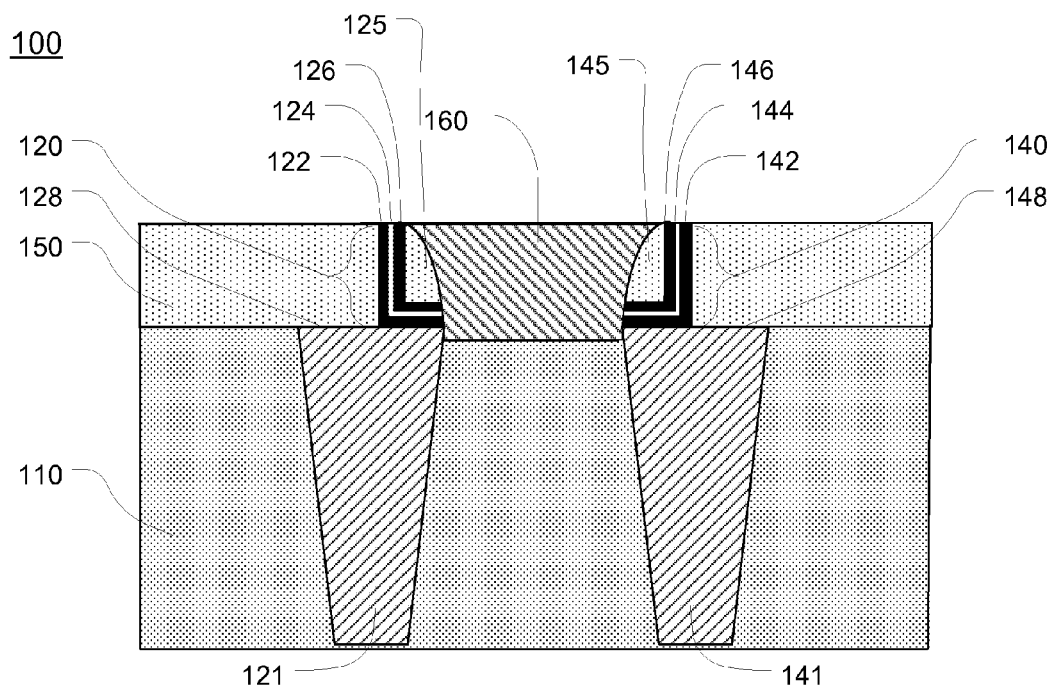
FIG. 1A
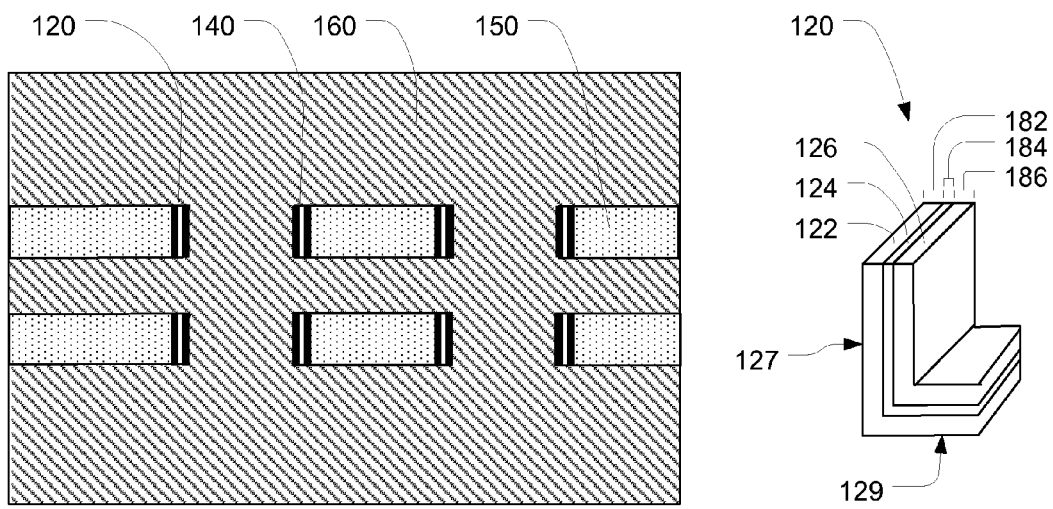
FIG. 1B            FIG. 1C

THERMALLY CONFINED ELECTRODE FOR PROGRAMMABLE RESISTANCE MEMORY

PARTIES TO A JOINT RESEARCH AGREEMENT

International Business Machines Corporation, a New York Corporation, and Macronix International Corporation, Ltd., a Taiwan corporation, are parties to a Joint Research Agreement.

FIELD OF THE INVENTION

The present invention relates to high density memory devices based on phase change memory materials, like chalcogenides, and on other programmable resistance materials, and methods for manufacturing such devices. More particularly, the present invention relates to electrode structures.

BACKGROUND OF THE INVENTION

Phase change materials exhibit a large resistivity contrast between crystalline (low resistivity) and amorphous (high resistivity) phases. An electrical current passed through a phase change material can set or reset a phase change memory (PCM) device. To set a PCM device into the crystalline phase, a medium electrical current pulse can be used. To reset a PCM device into the amorphous phase, a large electrical current pulse for a short time period can be used. To read the state of a PCM device, a small electrical current is required. Accordingly, applications of phase change memory can be limited by the high current required to reset the PCM device.

Electrodes can be significant sources of heat loss away from the active region of the device. Heat loss outside the active region is wasted, and causes a demand for more current during the reset operation. Device density in the PCM memory array can be determined by the size of the memory cell access device, typically a diode or transistor. The size of the access device is decided in part by the peak reset current required to pass through the device. Therefore reducing reset current is desirable for scalability, high-density, and low power consumption in memory devices, including PCM and other programmable resistance memory types.

SUMMARY

A memory, such as a PCM is described that includes a sidewall electrode having a layer of tantalum nitride, which thermally insulates a layer of more highly conductive electrode material from the bulk conductive structure, to reduce the heat loss and thereby reduce the reset current. Since much of the wasted power is by heat loss through the electrode structures, the engineering of one or both electrodes for better power efficiency is important. In one example, a tantalum-nitride/titanium-nitride/tantalum-nitride (TaN/TiN/TaN) thermal confining electrode structure is used to confine the heat dissipation and to focus the heat in the active region of the memory device. A method to fabricate a memory with the thermally confining electrode structure is also described. Embodiments of the thermally confined side-wall electrode are described which achieve 10× reduction in peak reset current in PCM devices using the structure.

BRIEF DESCRIPTION OF THE DRAWINGS

FIGS. 1A-1C illustrate a first embodiment of an array of thermally confined side-wall electrodes suitable for use in a phase change memory device, or other programmable resistance device.

DETAILED DESCRIPTION

A detailed description of embodiments of thermally confined side-wall electrodes for phase change memory devices and methods for manufacturing such electrodes are provided with reference to FIGS. 1-16.

Figure 15:
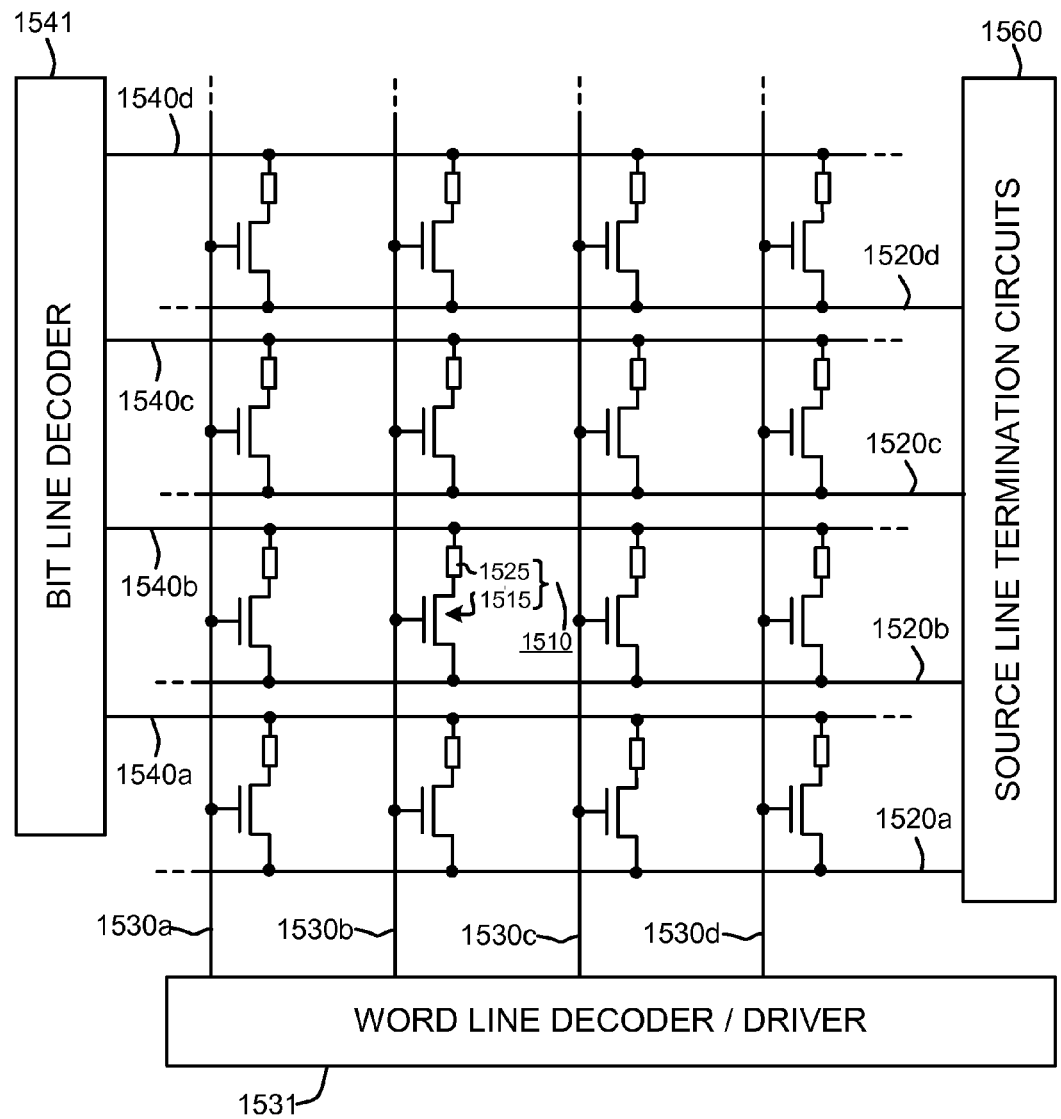
FIG. 15 is a schematic diagram of a memory array comprising phase change memory elements in accordance with an embodiment.

An embodiment of the present invention includes a plurality of side-wall electrodes formed on a first side-wall of a trench within an insulating layer over a first plurality of contacts in an array of contacts in a substrate. The plurality of side-wall electrodes contacts respective top surfaces of the first plurality of contacts. A second plurality of side-wall electrodes may be formed on a second side-wall of the trench over a second plurality of contacts in the array of contacts. The array of contacts may be coupled with an array of access devices. FIG. 15 and the description of FIG. 15 provide more information about access devices.

FIG. 1A illustrates a cross-section of a basic structure of a partial memory device 100 including plugs 121 and 141 surrounded by dielectric material 110, a first side-wall electrode 120, a second side-wall electrode 140, dielectric material 160 separating the electrode 120 from the electrode 140, and insulating material 150 defining a trench for the electrodes 120 and 140. An insulating spacer 125, 145 overlies the sidewall electrodes 120, 140, and can be used in the formation of the L-shaped cross-section of the sidewall electrodes 120, 140 as explained below.

Plug 121 is an example of a contact in the first plurality of contacts in an array of contacts. Plug 141 is an example of a contact in the second plurality of contacts in an array of contacts. In general, contacts in the array of contacts may be interlayer metal plugs as illustrated in FIG. 1A, or other electrical contacts, like a source or drain terminal of a transistor, a layer of silicide on a doped semiconductor, or other pad on which the side-wall electrode can make contact.

The first side-wall electrode 120 is an example of a side-wall electrode in the plurality of side-wall electrodes formed on a first side-wall of the trench. The second side-wall electrode 140 is an example of a side-wall electrode in the second plurality of side-wall electrodes formed on the second side-wall of the trench. Although FIG. 1A only illustrates a single side-wall electrode 120 for the first side-wall and a single side-wall electrode 140 for the second side-wall of the trench, the trench accommodates the plurality of side-wall electrodes on its first side-wall and the second plurality of side-wall electrodes on its second side-wall. Furthermore, the embodiment may have more than one trench.

FIG. 1B illustrates a top view of four pairs of isolated side-wall electrodes in two trenches. The electrode 120 is positioned partially over a top surface 128 of the plug 121. The electrode 120 comprises a first layer 122 of a first material, a second layer 124 of a second material deposited over the first layer 122, and a third layer 126 of the third material deposited over the second layer 124.

FIG. 1C illustrates a structure of the first side-wall electrode 120. The first layer 122 is shown to have a thickness 182 for the first material. The second layer 124 is shown to have a thickness 184 for the second material. The third layer 126 is shown to have a thickness 186 for the third material. The side-wall electrode includes a vertical portion, or leg 127, which lies on the sidewall of a corresponding trench. In the preferred embodiments described here, the side-wall electrode includes a horizontal portion, or foot 129, that lies on the top surface of the underlying contact. The foot provides an increased area of electrical contact from the electrode structure to the underlying contact. Also, the foot can improve the structural integrity and reliability of the side-wall electrode structure. The first layer 122 separates the second layer 124 at the low end of the leg 127, and in the foot 129, from the bulk of the underlying contact, inhibiting heat loss through direct contact of the more conductive electrode material of the second layer 124 to the thermal bulk of the underlying contact structure.

The electrode 140 is positioned partially over a top surface 148 of the plug 141. The electrode 140 comprises a first layer 142 of the first material, a second layer 144 of a second material deposited over the first layer 142, and a third layer 146 of the third material deposited over the second layer 144.

The first layer 122 of the first side-wall electrode 120 and the first layer 142 of the second side-wall electrode 140 are in contact with the top surface 128 of the plug 121 and the top surface 148 of the plug 141, respectively. The first layer 122 of the first side-wall electrode 120 and the first layer 142 of the second side-wall electrode 140 are thermally insulating nitride rich tantalum nitride layers separating top surfaces 128 and 148 of plugs 121 and 142 from the more conductive layers 124 and 144, respectively.

The first material serves as a thermal barrier to suppress heat loss through plugs that can have large thermal mass and have good thermal conductivity. The first material described herein consists of a nitride rich tantalum nitride ($Ta_xN_y$, where the x/y ratio is less than 1). The $Ta_xN_y$ can be for example, $Ta_3N_5$, $Ta_2N_3$, or a mixture thereof. $Ta_xN_y$ can be fabricated by physical vapor deposition (PVD), chemical vapor deposition (CVD), and atomic layer deposition (ALD).

The second material for the second layers 124 and 144 comprises an electrode material that has a lower electrical resistivity and lower thermal resistivity than the first material. The electrode material can include titanium nitride (TiN) or other material chosen for compatibility with the first material. The electrode material can include a material or combination of materials selected from the group of $Ta_xN_y$, where the x/y ratio is greater than 1, e.g. Ta, W, W-silicide, Pt, Ru, $RuO_2$, Ir, and $IrO_2$. The second layers 124 and 144 can provide the primary conducting paths for the sidewall electrodes 120 and 140.

The electrical conductivity of TiN is 5~1000 times of that of nitride rich tantalum nitride. The electrical conductivity ratio of the preferred nitride rich tantalum nitride over TiN can be 0.001~0.2. The thermal conductivity ratio of the nitride rich tantalum nitride over TiN can be 0.001~0.9. The thickness range of nitride rich tantalum nitride can be from 1 nanometer to 20 nanometers and the thickness range of TiN can be from 0.4 nanometers to 10 nanometers.

The dielectric material 110 may be $SiO_2$, another silicon oxide, or other insulating material including some low-k dielectric materials, suitable for use as an interlayer dielectric. The insulating material 150 may be a silicon nitride. The material of the spacers 125, 145 may also be a silicon nitride.

Plugs in general are used for interconnects to underlying selectors or access devices. The plugs 121 and 141 may silicide (WSi, CoSi, NiSi etc.), or metal (W, TiN, Cu etc.). The dielectric material 160 may be SiN, $SiO_2$, and other insulating materials including some low-k dielectric materials, usable for interlayer dielectrics in these setting. The plugs 121 and 141 in this example are coupled to an underlying substrate that includes an array of access devices or other access structures (e.g. word lines or bit lines), used for selecting memory cells that include the sidewall electrodes. Also, the plugs may include vertical transistors or diodes which act as access devices. In other embodiments, the array of access devices may be coupled to another electrode, e.g. an overlying electrode, for the memory devices, while the contacts are coupled to a more passive access structure (e.g. word line or bit line).

Figure 2A:
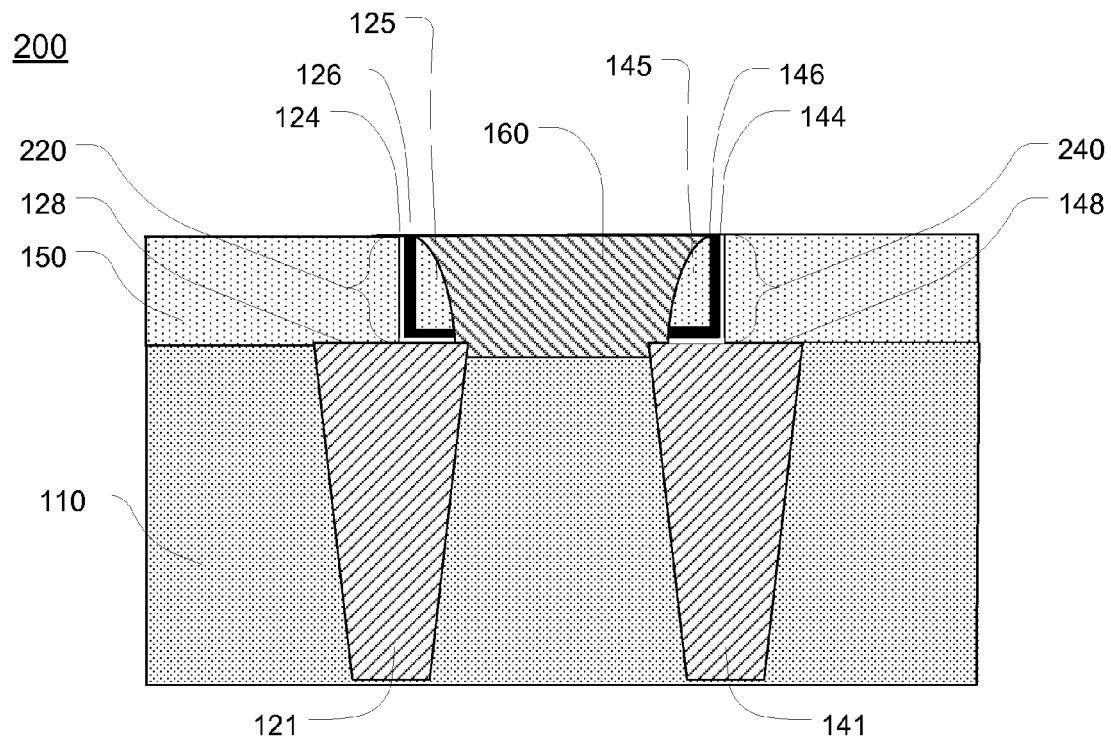
FIGS. 2A and 2B illustrate a second embodiment of an array of thermally confined side-wall electrodes.
Figure 2B:
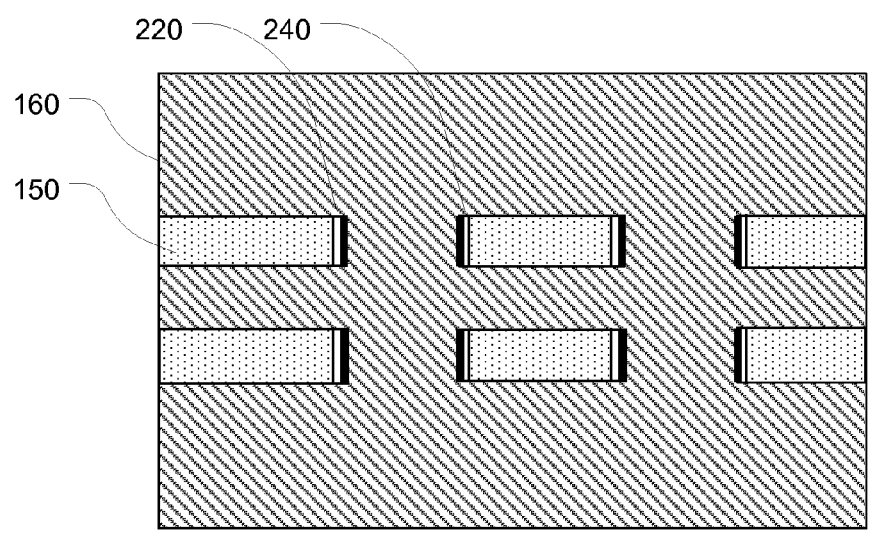

FIG. 2A and FIG. 2B illustrate a second embodiment 200 of the present invention. In the first embodiment illustrated by FIG. 1A and FIG. 1B, both sides of second layers 124 and 144 made of the electrode material for conducting paths are insulated by a thermal barrier of nitride rich tantalum nitride. In the second embodiment, the outer side of second layers 124 and 144 is insulated by nitride rich tantalum nitride in the leg and foot portions of the structure. The specifications for materials in the second embodiment can be the same as in the first embodiment.

In comparison to FIG. 1A and FIG. 1B, the first layer 122 of the first side-wall electrode 120 and the first layer 142 of the second side-wall electrode 140 are absent. The second layer 124 of the first side-wall electrode 220 and the second layer 144 of the second side-wall electrode 240 are in contact with the top surface 128 of the plug 121 and the top surface 148 of the plug 141, respectively.

Figure 3A:
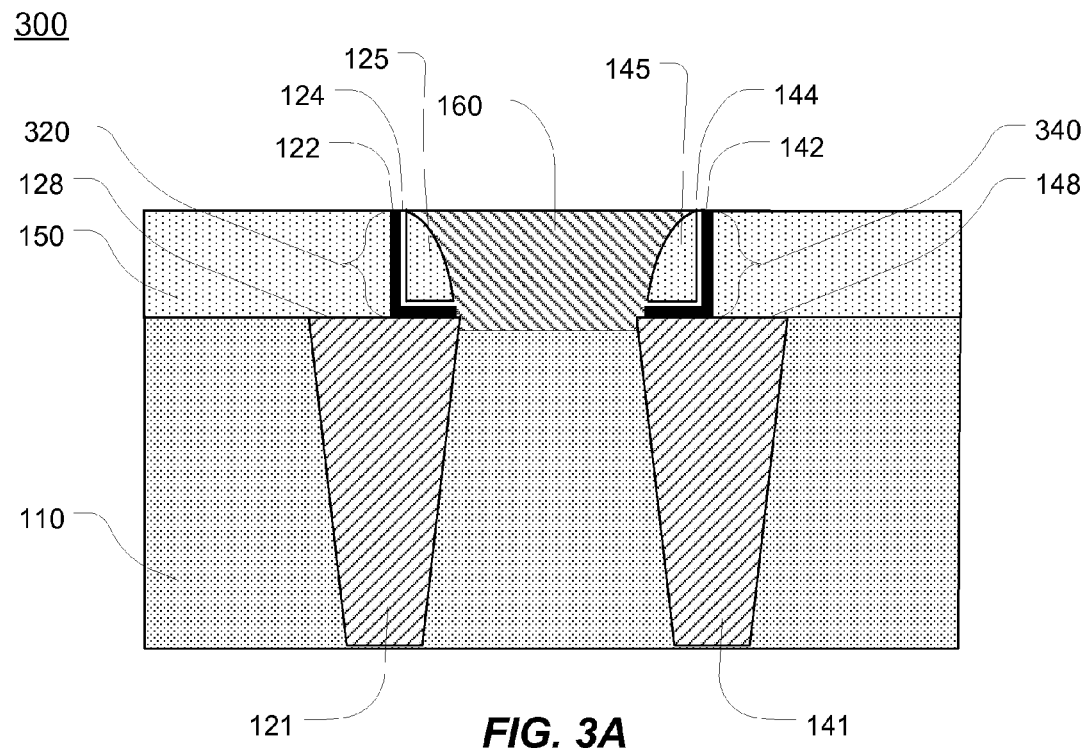
FIGS. 3A and 3B illustrate a third embodiment of an array of thermally confined side-wall electrodes.
Figure 3B:
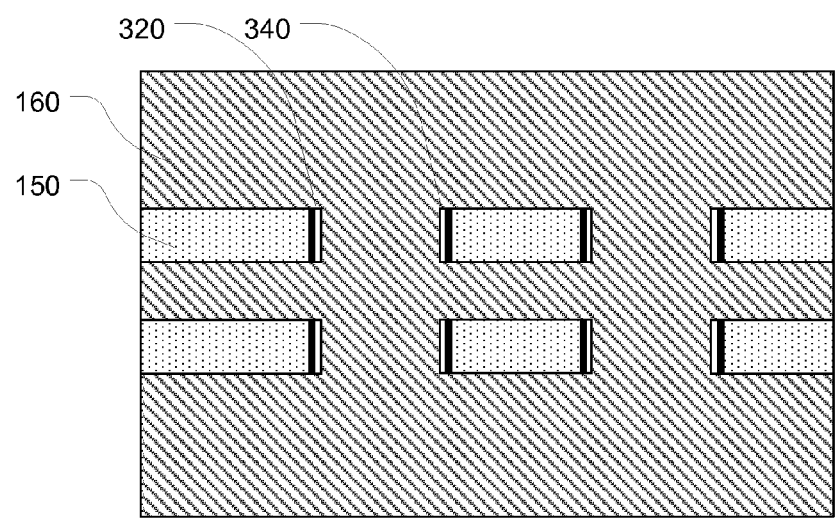

FIG. 3A and FIG. 3B illustrate a third embodiment 300 of the present invention. In the first embodiment illustrated by FIG. 1A and FIG. 1B, both sides of second layers 124 and 144 made of TiN for conducting paths are insulated by a thermal barrier of material $Ta_xN_y$. In the third embodiment, the inner sides of second layers 124 and 144 are insulated by the layer of nitride rich tantalum nitride in both the leg and foot portions of the side-wall electrode. The specifications for materials in the third embodiment are the same as in the first embodiment.

In comparison to FIG. 1A and FIG. 1B, the third layer 126 of the first side-wall electrode 120 and the third layer 146 of the second side-wall electrode 140 are absent. The first layer 122 of the first side-wall electrode 320 and the first layer 144 of the second side-wall electrode 340 are in contact with the top surface 128 of the plug 121 and the top surface 148 of the plug 141, respectively.

In addition to TiN, the high electrical conductivity materials, surrounded by the thermal barrier $Ta_xN_y$ with low thermal conductivity, may be TaN, Ta, W, W-silicide, Pt, Ru, $RuO_2$, Ir, $IrO_2$ etc. for all embodiments.

A detailed description of methods for manufacturing embodiments of thermally confined side-wall electrodes for phase change memory devices is provided with reference to FIGS. 4-14.

To manufacture side-wall electrodes, an array of access devices or other access structure (not shown) is first fabricated in the substrate. The array of access devices is coupled to the array of contacts. A memory cell is to be coupled to an access device in the array of access devices. The access device may be a transistor or a diode. The access device and the memory cell are typically electrically coupled in series between a bit line and a source line in a memory array.

Figure 4A:
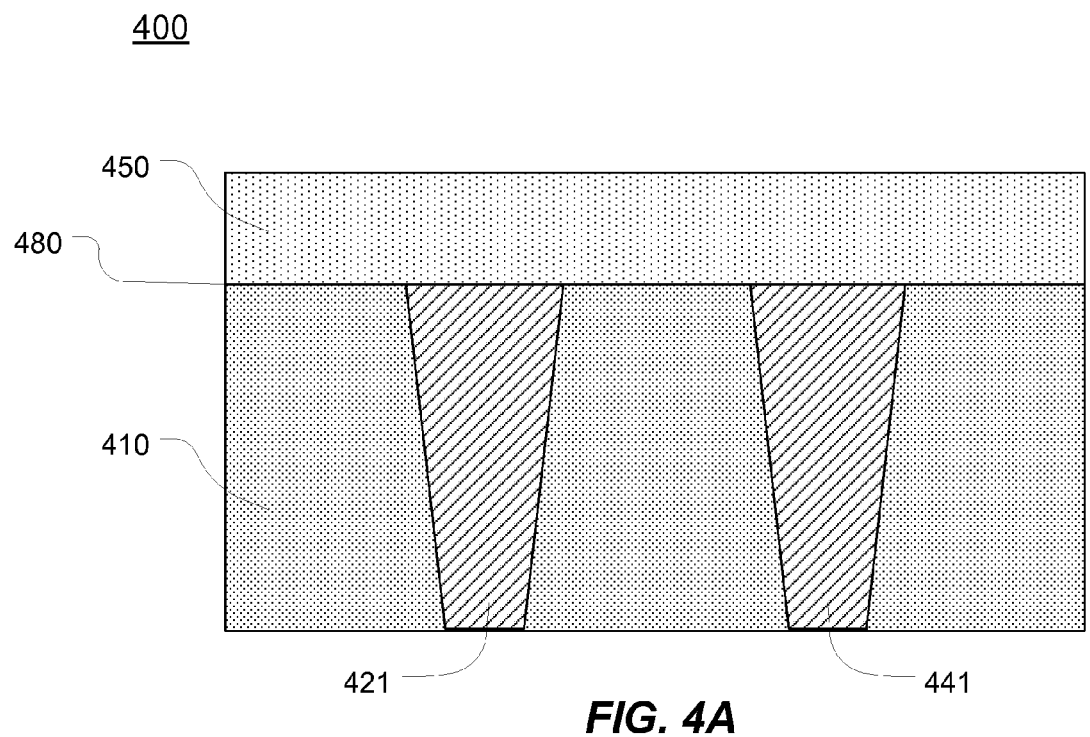
FIGS. 4A-14 are cross-sectional views and top views illustrating sub-assemblies in a fabrication sequence of phase change memory devices having thermally confined side-wall electrodes.
Figure 4B:
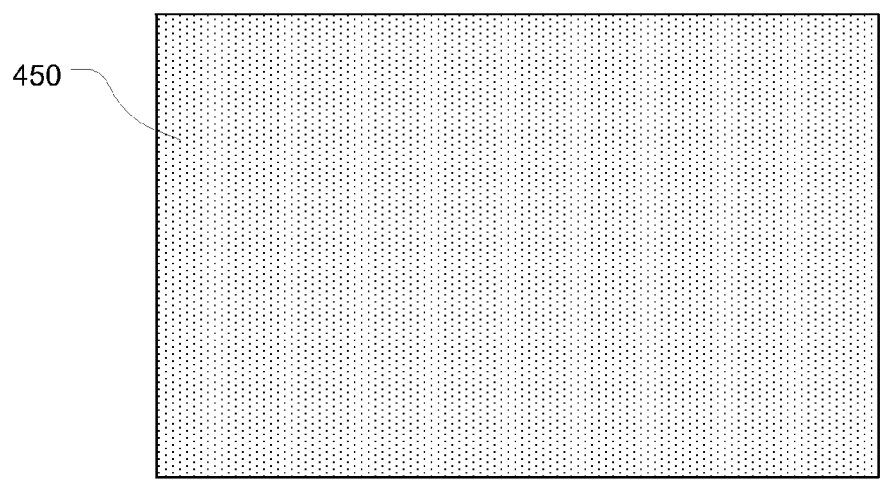

FIG. 4A illustrates a cross-section of a partially fabricated substrate 400 including plugs 421 and 441, exemplary of contacts in the array of contacts in the substrate. Plugs 421 and 441 are surrounded by dielectric material 410 which may be $SiO_2$. The dielectric material 410 and the plugs 421 and 441 are planarized to provide a first planarized surface 480. A first insulating layer 450 of insulating material, e.g. SiN, is formed on the first planarized surface 480. FIG. 4B is a top view of the substrate 400 showing the first insulating layer 450 prior to patterning.

Figure 5A:
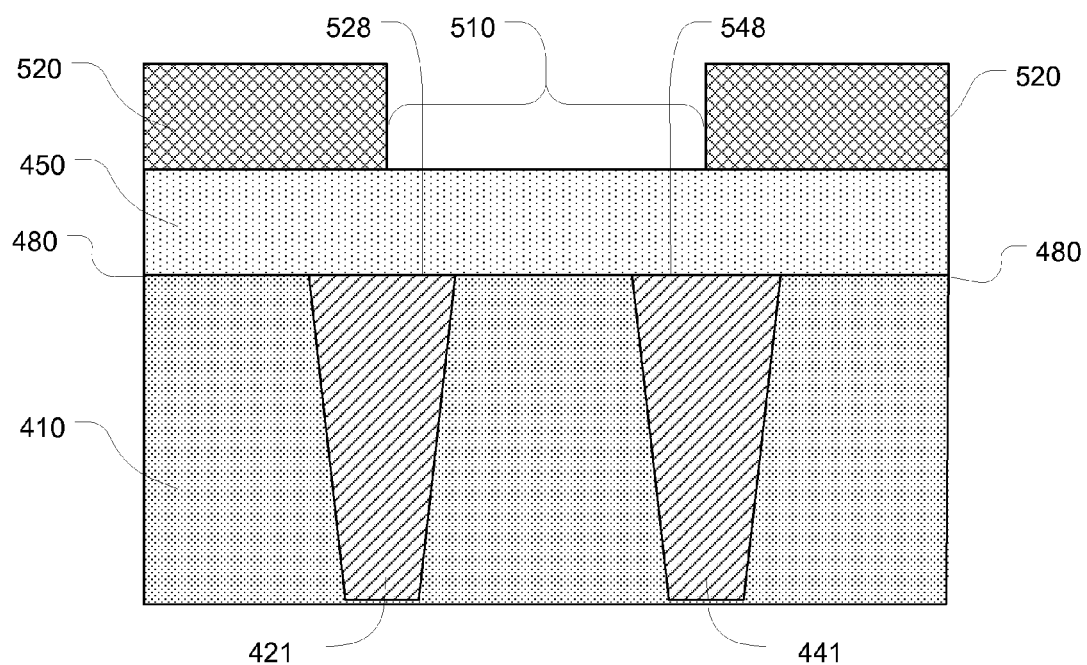
Figure 5B:
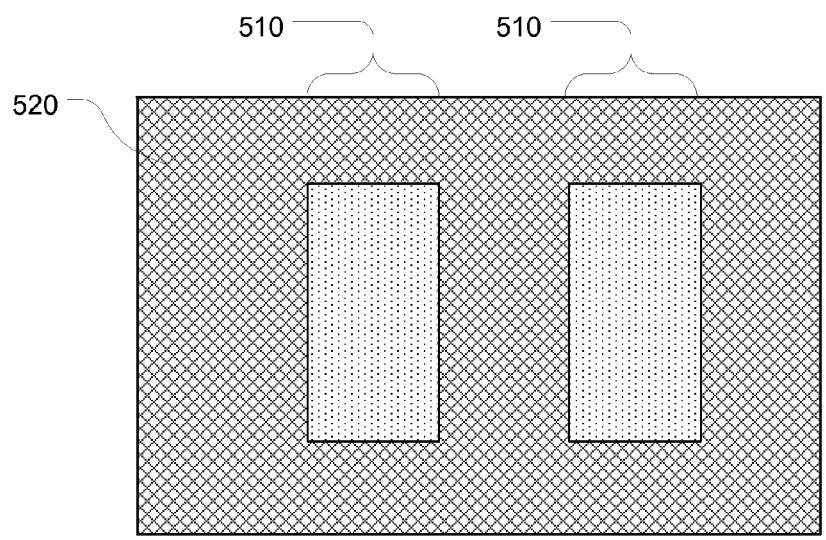

In reference to FIG. 5A, a region 510 is defined on the first insulating layer 450 with a first lithography pattern 520 of photoresist material, such that the region 510 is aligned partially over top surfaces 528 and 548 of the plugs 421 and 441, respectively. FIG. 5B shows a top view of two instances of the region 510 surrounded by the first lithography pattern 520. In a large array, the region 510 is elongated on a row or column of contacts in the array of contacts, which can include a very large number of contacts.

Figure 6A:
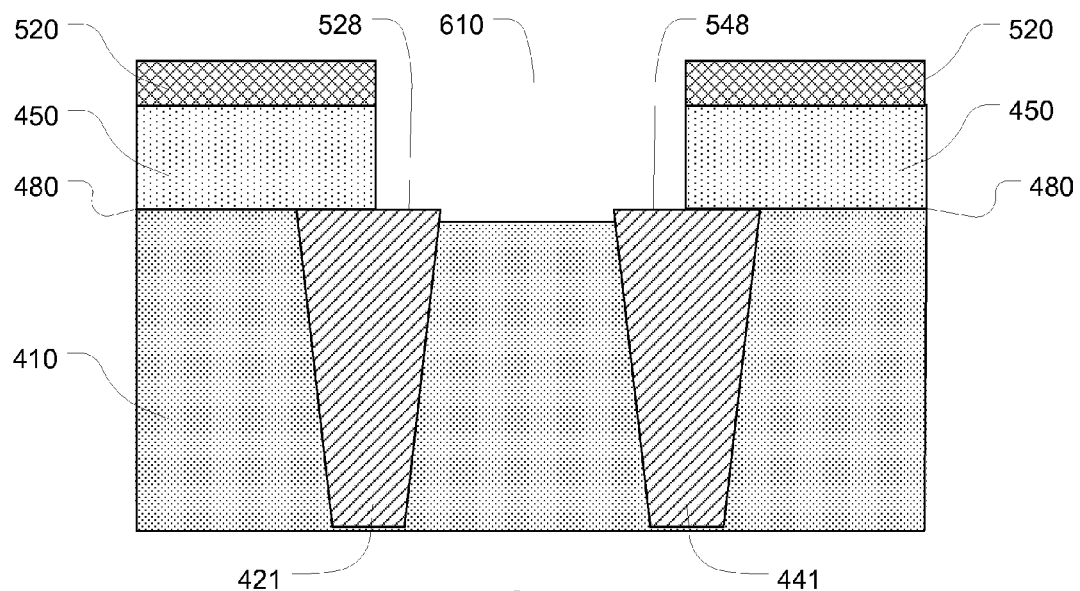
Figure 6B:
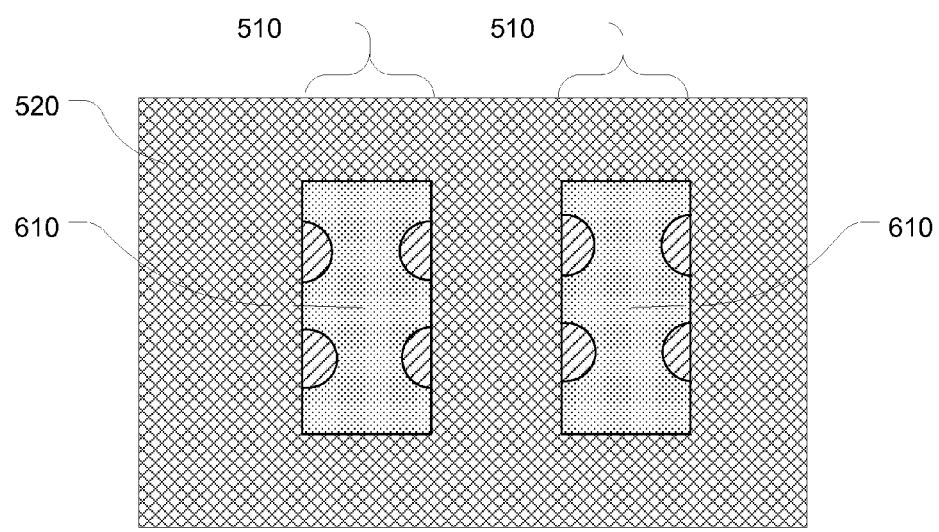

In reference to FIG. 6A, an etching process removes a portion of the first insulating layer 450 under the region 510 defined by the first lithography pattern 520 to partially expose the top surfaces 528 and 548 of the plugs 421 and 441, respectively, and to expose a portion 610 of the dielectric material 410 surrounding the plugs 421 and 441. FIG. 6B shows a top view of the exposed portions of the top surfaces 528 and 548 of the plugs 421 and 441, and the exposed portion 610 of the dielectric material 410 surrounding the plugs 421 and 441. In FIG. 6A, a cross-section of one pair of plugs in one region 510 is shown. In FIG. 6B, a top view of four pairs of partially exposed plugs in two such regions are shown.

Figure 7A:
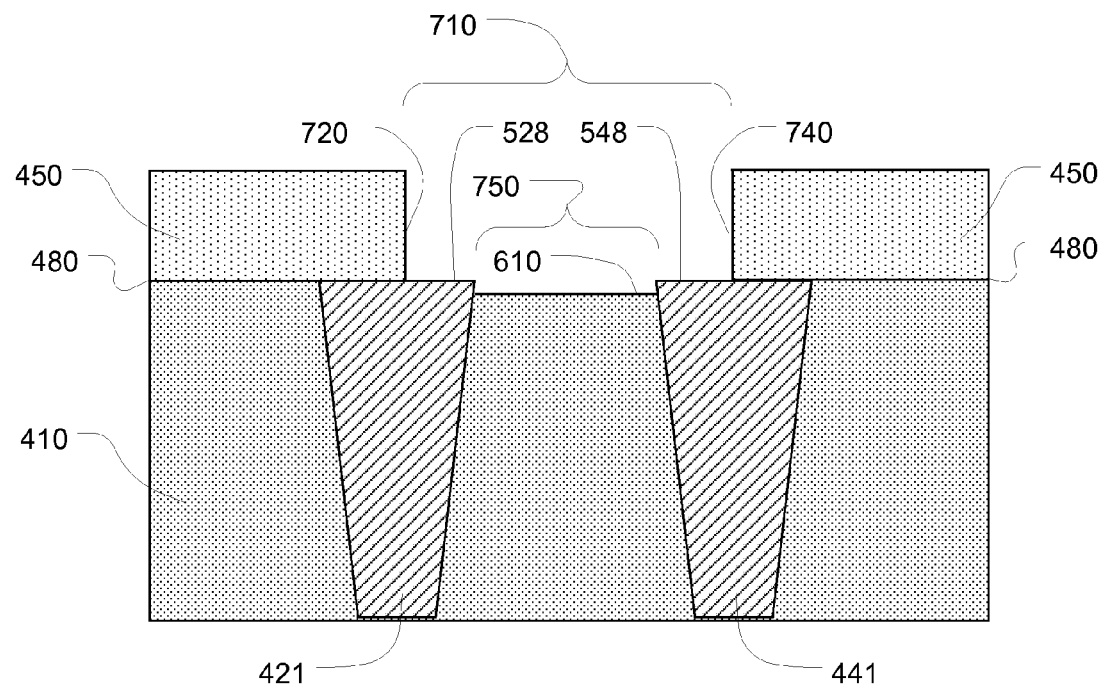
Figure 7B:
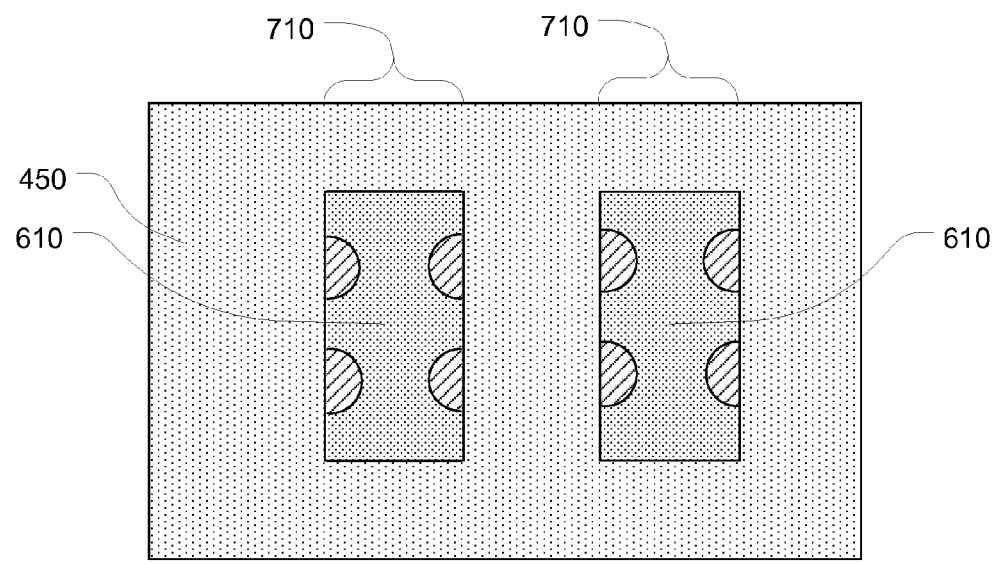

In reference to FIG. 7A and FIG. 7B, the first lithography pattern 520 of photoresist material is stripped such that the first insulating layer 450 is exposed. A trench 710 is formed, including a sidewall 720 above the plug 421, a sidewall 740 above the plug 442, and exposing portions of the top surfaces 528 and 548 of the plugs 421 and 442, and the portion 610 of the dielectric material 410 surrounding the exposed portions of the top surfaces 528 and 548. FIG. 7B illustrates a top view of two instances of the trench 710.

Figure 8A:
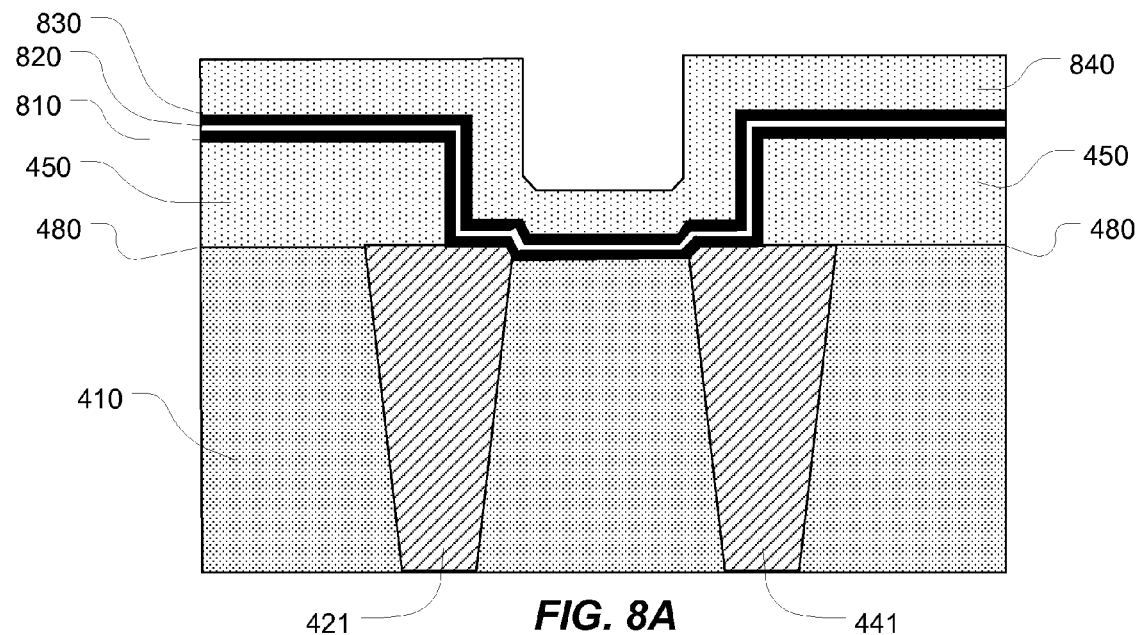
Figure 8B:
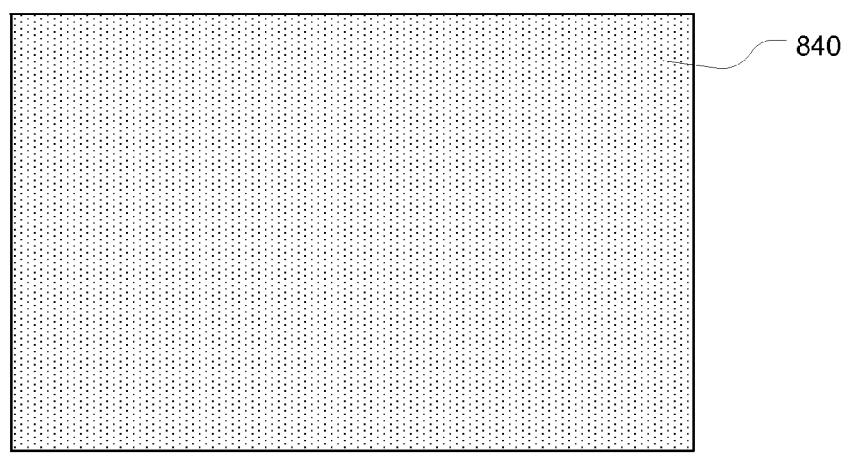

In reference to FIG. 8A, a sequence of layers of materials is deposited in a blanket or unpatterned deposition in the area of the memory array. A first layer 810 of a first material is deposited over the trench 710 and over the first insulating layer 450 surrounding the trench 710. A second layer 820 of a second material is deposited over the first layer 810. A third layer 830 of the first material is deposited over the second layer 820. A second insulating layer 840 of insulating spacer material is then deposited over the third layer 830. FIG. 8B is a top view of the second insulating layer 840.

The first material serving as a thermal barrier comprises nitride rich tantalum nitride. Nitride rich tantalum nitride can be fabricated by physical vapor deposition (PVD), chemical vapor deposition (CVD), and atomic layer deposition (ALD). The second material has higher electrical conductivity and may be titanium nitride (TiN) or other electrode material, as discussed above.

Figure 9A:
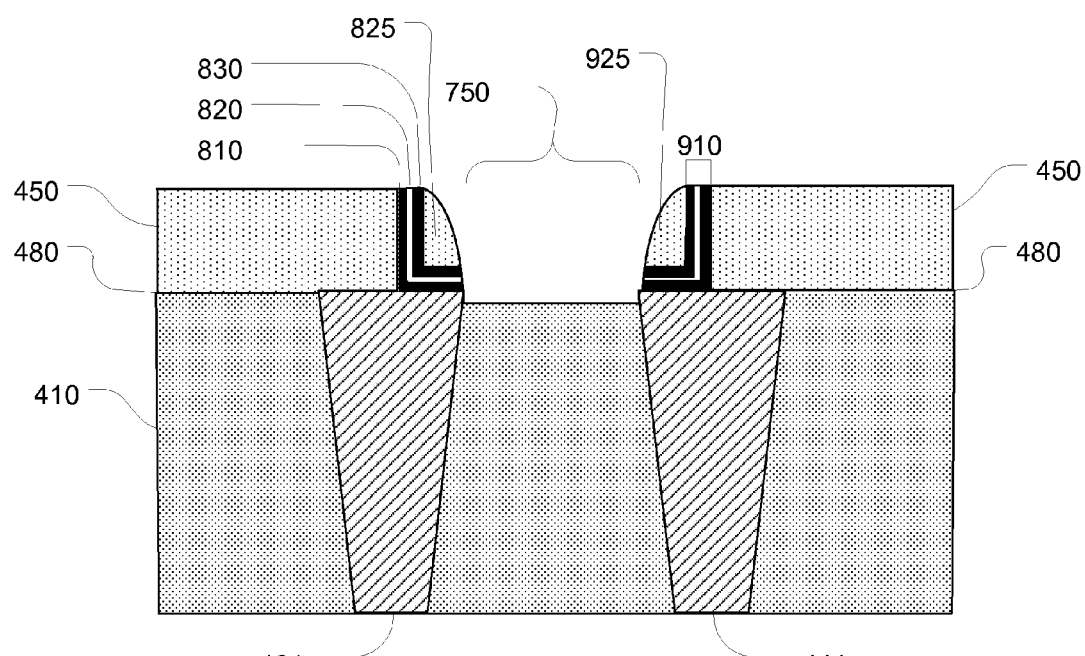
Figure 9B:
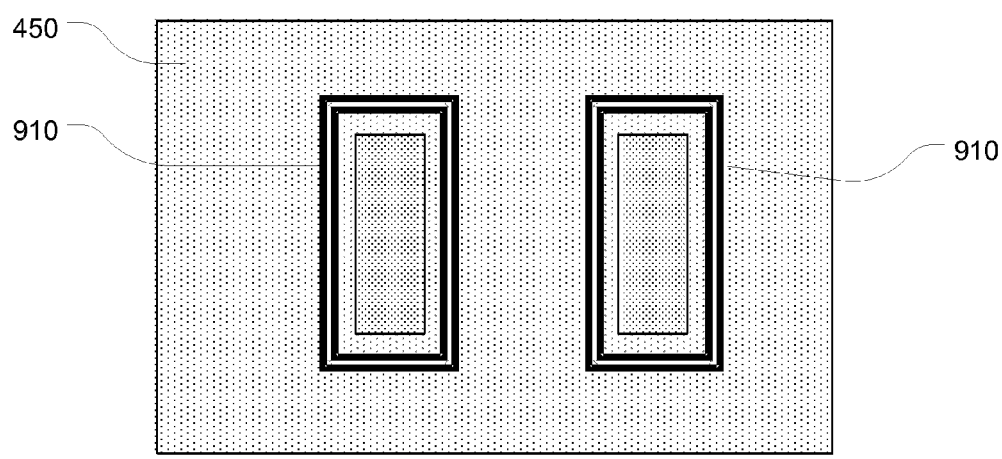

In reference to FIG. 9A, a spacer etching removes the first layer 810, the second layer 820, the third layer 830, and the second insulating layer 840 in a center region 750 of the trench 710 and outside the trench 710 while keeping the same four layers lining vertical surfaces 720 and 740 of the trench 710 and the partially exposed top surfaces 528 and 548 of the plugs 421 and 441, respectively. A spacer 825 and a spacer 925 overlie the first, second and third layers. The thickness of the spacers 825, 925 results in the foot portions of the sidewall electrodes having widths that correlate with the thickness of the layer 840. FIG. 9B is a top view of two trenches 710 showing top surfaces 910 of the first layer 810, the second layer 820, and the third layer 830. The top surfaces 910 are surrounded by the first insulating layer 450.

Figure 10A:
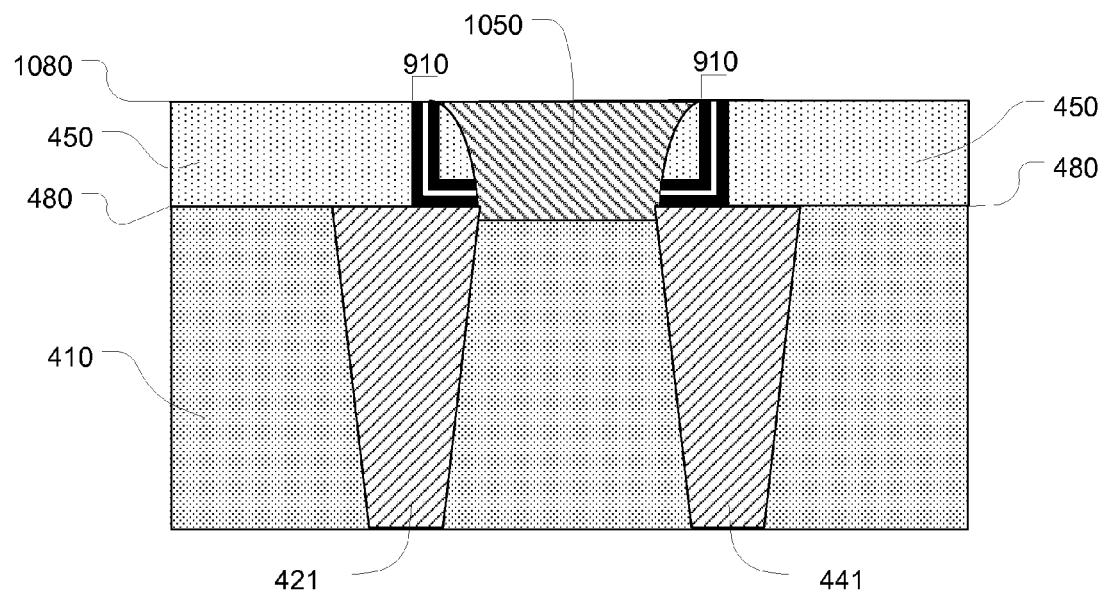
Figure 10B:
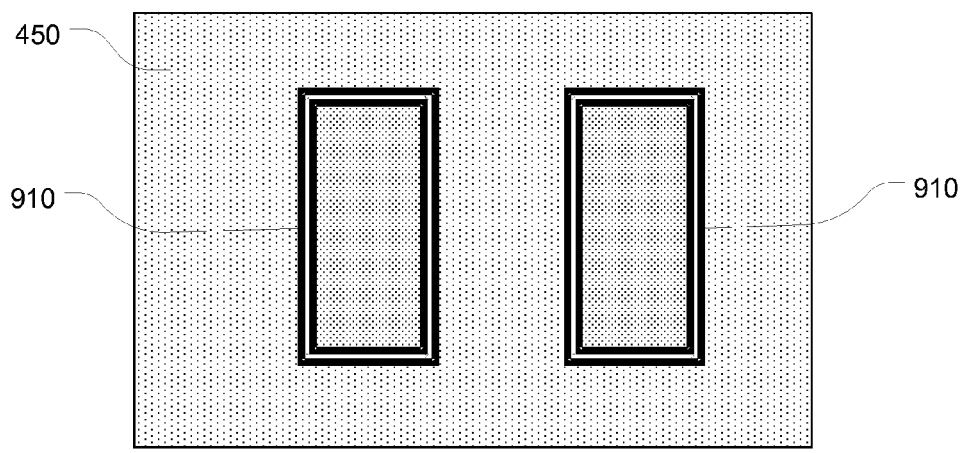

In reference to FIG. 10A and FIG. 10B, the trench 710 is filled with a dielectric material 1050 and then planarized to provide a second planarized surface 1080 co-planar with the top surfaces 910 of the first layer 810, the second layer 820, and the third layer 830.

Figure 11A:
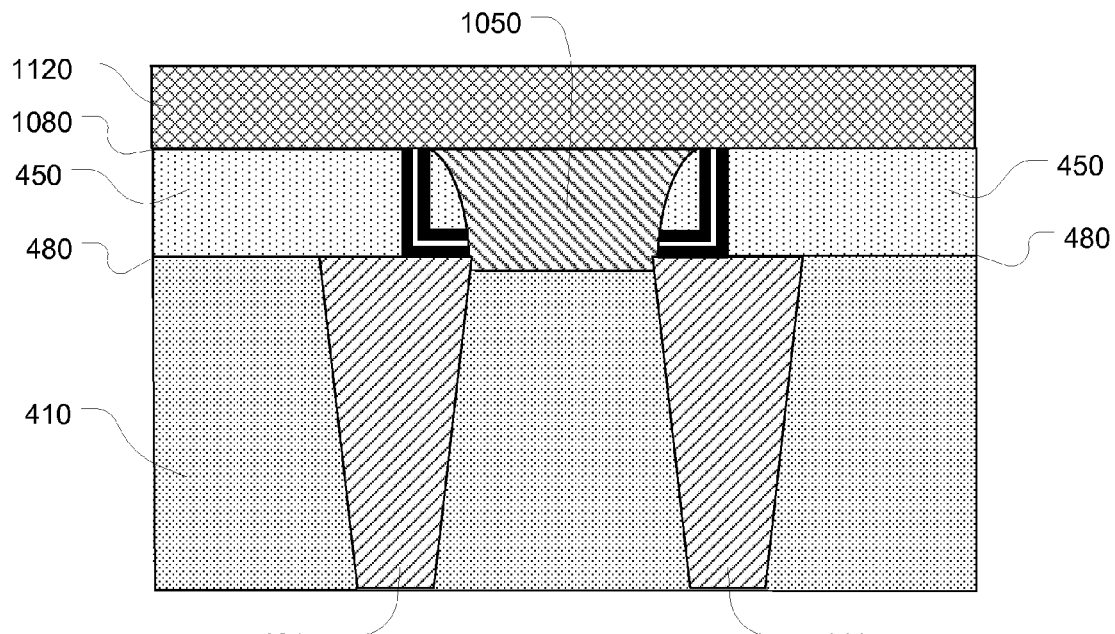
Figure 11B:
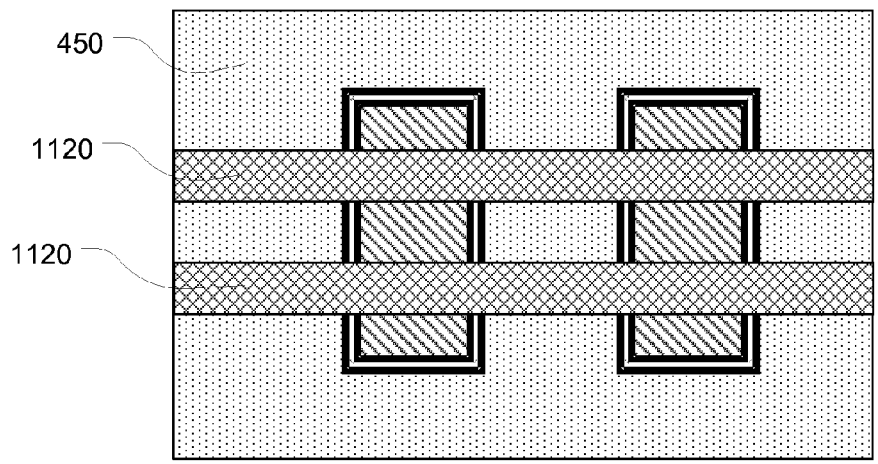

In reference to FIG. 11A, a second lithography pattern 1120 of photo resist material defines an electrode width on the second planarized surface 1080 so as to divide the sidewall layers and form isolated side-wall electrodes. FIG. 11B illustrates that the second lithography pattern 1120 is positioned in stripes over areas where isolated side-wall electrodes are to be formed.

Figure 12A:
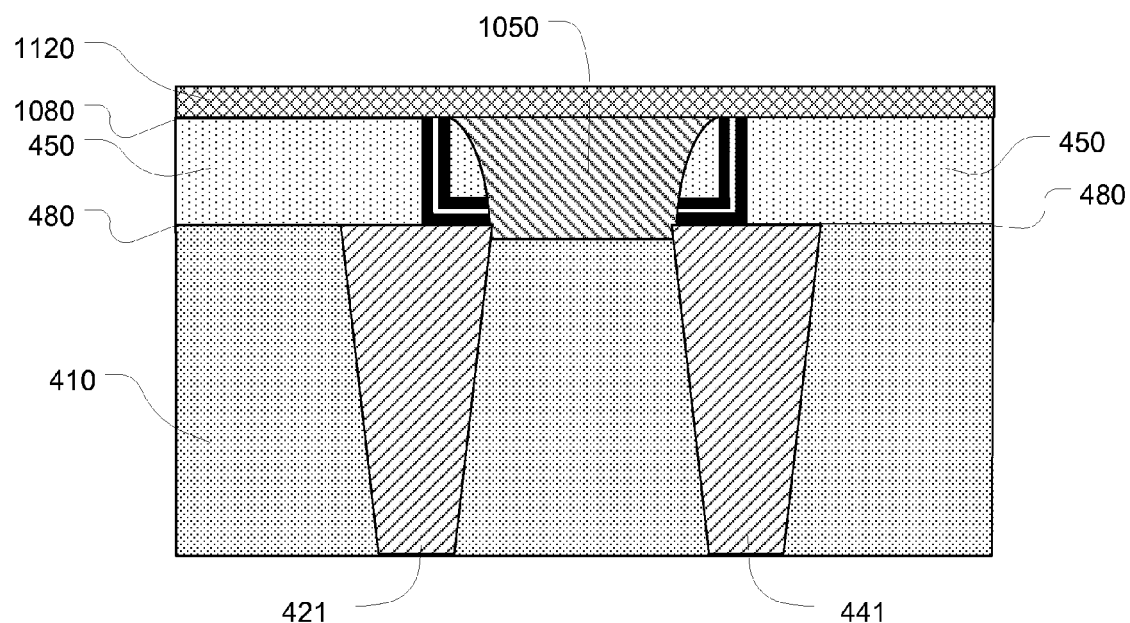
Figure 12B:
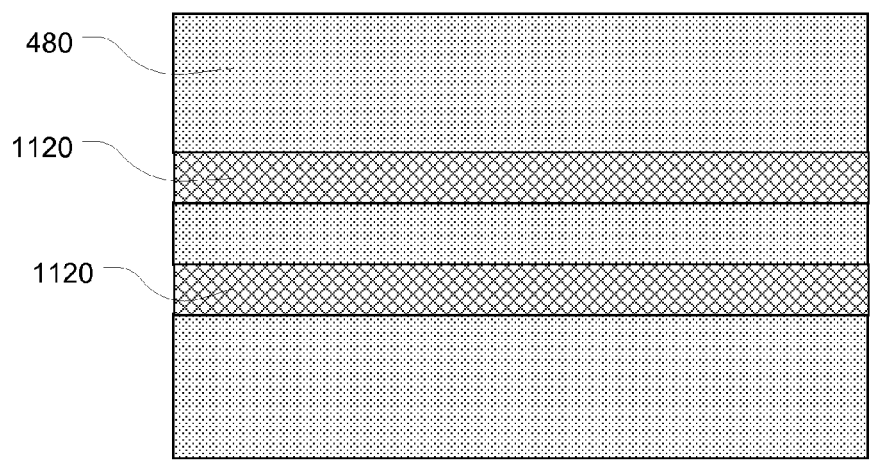

In reference to FIG. 12A, an etching process removes materials outside the second lithography pattern 1120 to expose the first planarized surface 480. The materials removed include portions of the first layer 810, the second layer 820, and the third layer 830 of materials, the dielectric material 1050, and the first insulating layer 450. FIG. 12B is a top view of the second lithography pattern 1120 and the exposed portion of the first insulating layer 450.

Figure 13A:
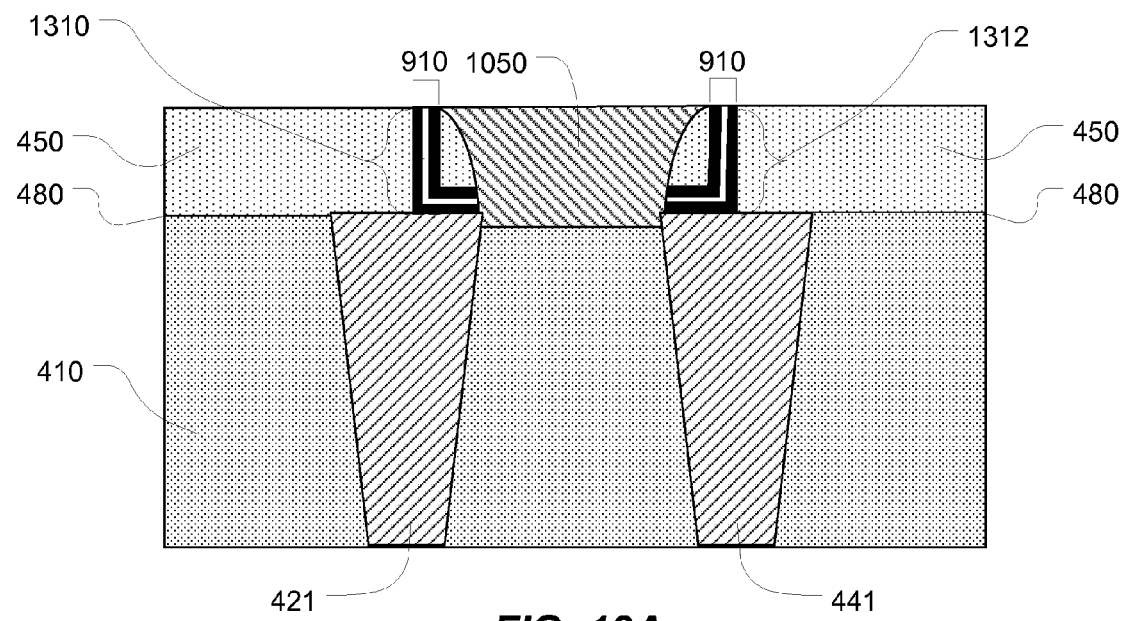
Figure 13B:
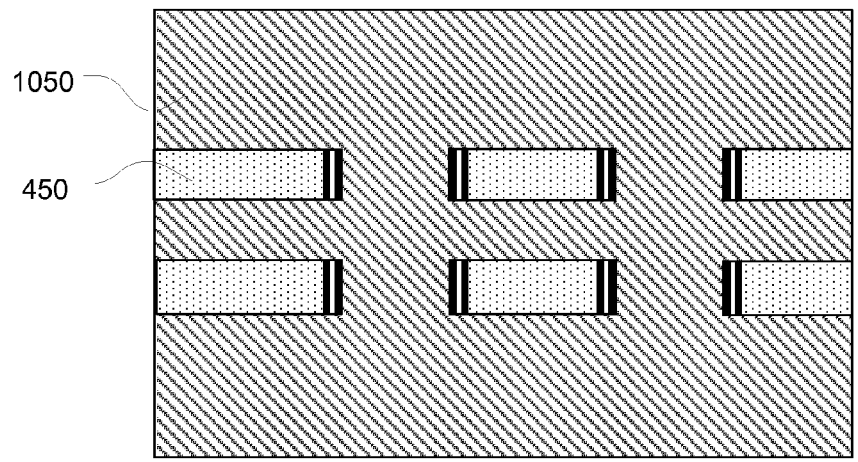

In reference to FIG. 13A, the second lithography pattern 1120 is stripped. Dielectric material 1050 is filled in the area where materials outside the second lithography pattern 1120 have been removed. Dielectric material 1050 is then planarized to expose isolated side-wall electrodes 1310 and 1320 for subsequent processing. FIG. 13B illustrates four pairs of such exposed isolated side-wall electrodes. The top surfaces of the side-wall electrodes have areas that are defined by the thickness of the first, second and third layers, in this example, and by the width defined by the stripes of the second lithography pattern. In other examples, the side-wall electrodes can be tapered or otherwise processed to reduce the width dimension.

Side-wall electrodes formed in this embodiment have the material composition of $Ta_xN_y$—TiN—$Ta_xN_y$ such that the high electrical conductivity material such as TiN is surrounded by a thermal barrier of nitride rich tantalum nitride on both sides. In another embodiment, the material composition for side-wall electrodes may be $Ta_xN_y$—TiN or TiN—$Ta_xN_y$ such that the high electrical conductivity material such as TiN is surrounded by a thermal barrier of nitride rich tantalum nitride on only one side.

Figure 14:
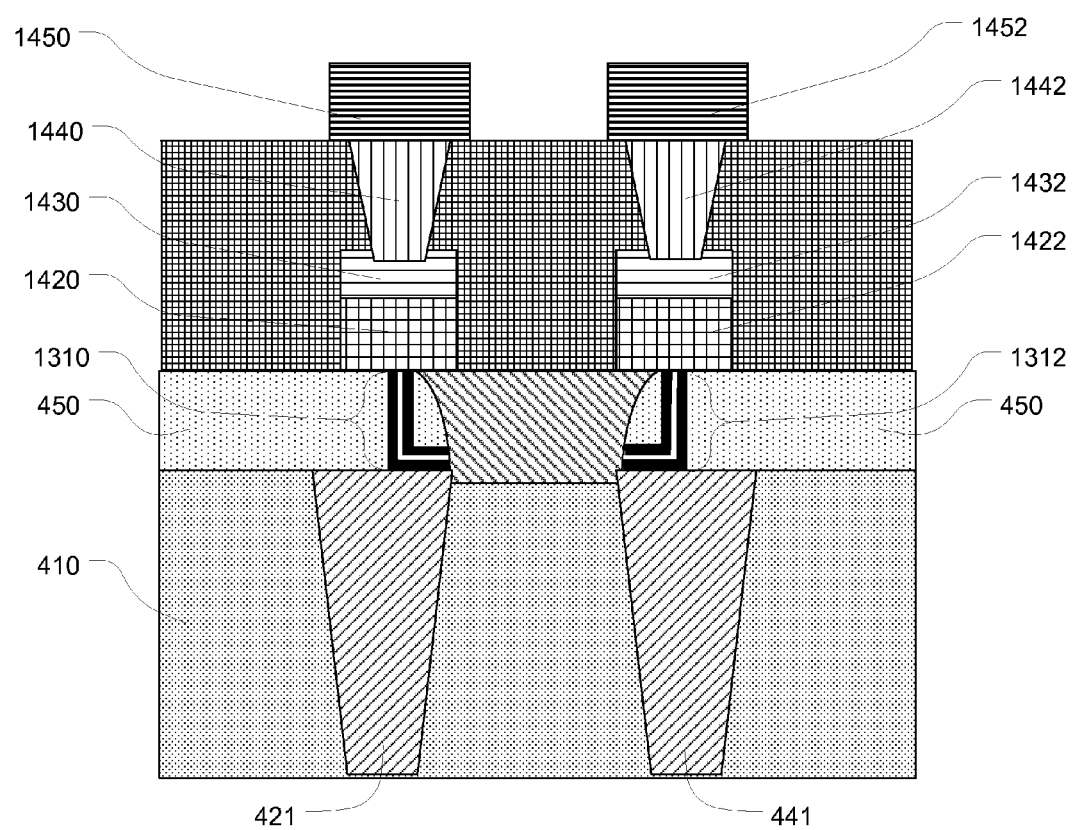

FIG. 14 illustrates one example of a completed a phase change memory device with composite $Ta_xN_y$—TiN—$Ta_xN_y$ side-wall electrodes 1310 and 1312. Phase change memory material 1420 and 1422 are positioned between, in contact with, and electrically coupled to the electrode top surfaces of the side-wall electrodes 1310 and 1312 and bottom surfaces of top electrodes 1430 and 1432, respectively. The side-wall electrodes 1310 and 1320 are electrically coupled to plugs 421 and 441, and to phase change memory material 1420 and 1422, respectively. Top electrodes 1430 and 1432 are electrically coupled to phase change memory material 1420 and 1422, and to metal vias 1440 and 1442, respectively. Metal lines 1450 and 1452 are electrically coupled to metal vias 1440 and 1442, respectively. Other programmable resistance materials can be used as well.

FIG. 15 is a schematic diagram of a portion of a memory cell array 1500 implemented using phase change memory cells, as is typical of integrated circuit memory designs. The array 1500 comprises a plurality of bit lines 1540a-1540d extending in parallel in a first direction and in electrical communication with bit line decoder 1541. A plurality of word lines 1530a, 1530b, 1530c, 1530d extend in parallel in a second direction and are in electrical communication with word line decoder/driver 1531. In the schematic diagram of FIG. 15, each of the memory cells (e.g. a cell including phase change memory element 1525) of array 1500 is coupled to an access device (e.g. transistor 1515) arranged in electrical series between a bit line in the set of bit lines 1540a-1540d, that is in turn coupled to a bit line decoder 1541, and a source line 1520a-1520d. Other devices can be arranged to act as access devices including, for example, bipolar junction transistors and diodes, in memory arrays of this sort.

Memory cell 1510 is representative of memory cells in array 1500 and includes a side-wall electrode on a plug coupled to an access device such as a field effect transistor 1515, which includes a phase change memory element 1525, comprising a phase change material, for example, and includes a top electrode coupled to the phase change memory element 1525. In the example described herein, the phase change memory element 1525 includes a thermally confined side-wall electrode. The memory element 1525 and transistor 1515 are arranged electrically in series between the bit line (e.g. 1540b) and the corresponding source line termination circuits 1560 via the source line 1520b. The word line 1530b controls the gate terminal of the transistor 1515.

Figure 16:
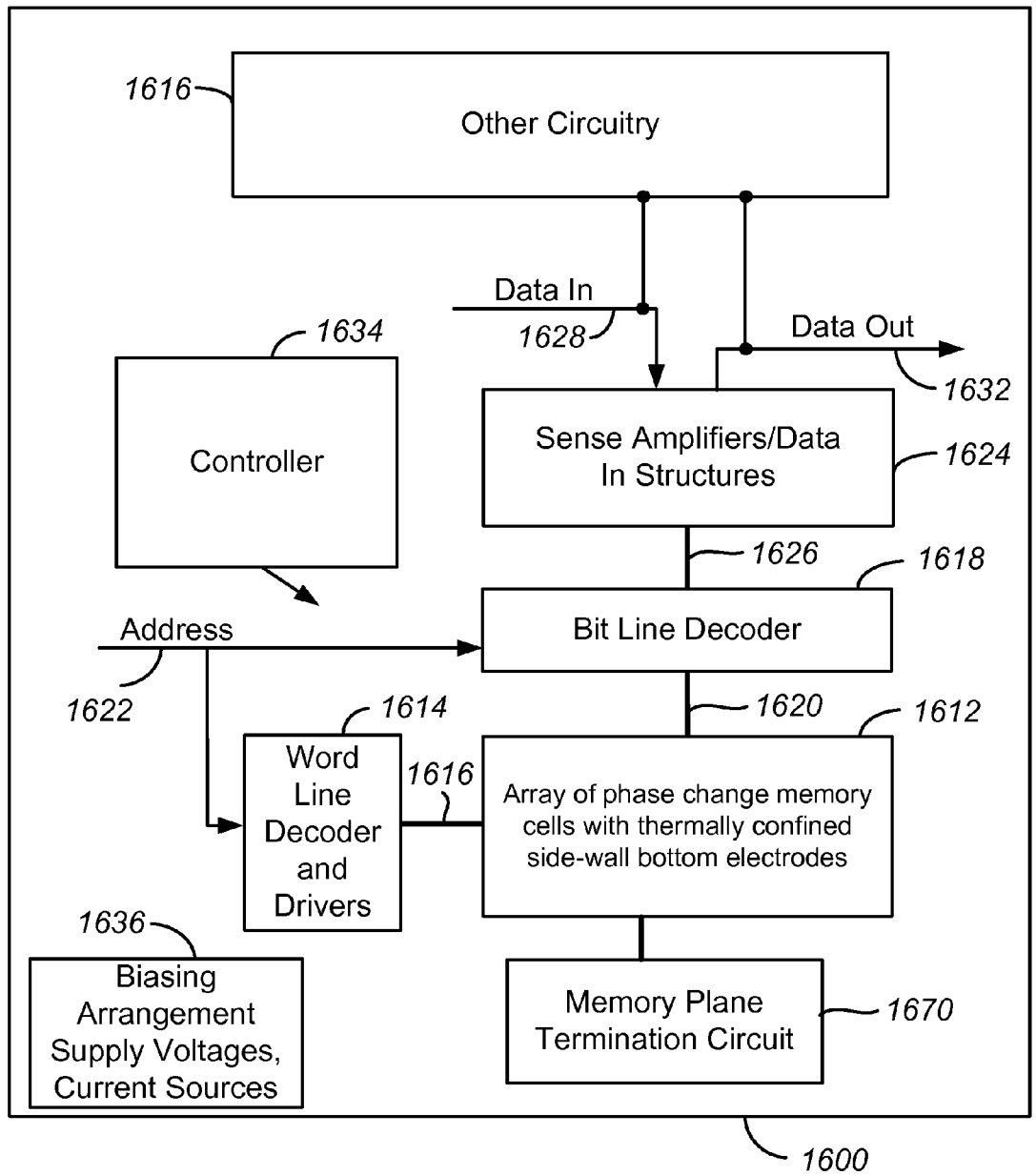
FIG. 16 is a block diagram of an integrated circuit device including a phase change memory array in accordance with an embodiment.

FIG. 16 is a simplified block diagram of an integrated circuit 1600 including a memory array 1612 implemented using phase change memory cells with side-wall electrodes as described herein. A memory plane termination circuit 1670 is coupled to the array and provides a common voltage to the memory plane of the array 1612. A word line decoder 1614 having read, set and reset modes is coupled to and in electrical communication with a plurality of word lines 1616 arranged along rows in the memory array 1612. A bit line (column) decoder 1618 is in electrical communication with a plurality of bit lines 1620 arranged along columns in the array 1612 for reading, setting, and resetting the phase change memory cells (not shown) in array 1612. Addresses are supplied on bus 1622 to word line decoder and drivers 1614 and bit line decoder 1618. Sense amplifiers and data-in structures in block 1624, including voltage and/or current sources for the read, set, and reset modes are coupled to bit line decoder 1618 via data bus 1626. Data is supplied via a data-in line 1628 from input/output ports on integrated circuit 1600, or from other data sources internal or external to integrated circuit 1600, to data-in structures in block 1624. Other circuitry 1616 may be included on integrated circuit 1600, such as a general purpose processor or special purpose application circuitry, or a combination of modules providing system-on-a-chip functionality supported by array 1612. Data is supplied via a data-out line 1632 from the sense amplifiers in block 1624 to input/output ports on integrated circuit 1600, or to other data destinations internal or external to integrated circuit 1600.

A controller 1634 implemented, in this example, using a bias arrangement state machine, controls the application of bias arrangement supply voltages and current sources 1636, such as read, set, reset, erase verify and program verify voltages and/or currents. Controller 1634 may be implemented using special-purpose logic circuitry as known in the art. In alternative embodiments, controller 1634 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1634.

The power generated in the side-wall electrode can be delivered to the memory element very efficiently (omitting power lost to thermal sinks other than the memory material) using the electrode described herein. One simulation has shown that for the same amount of current, thermally confined sidewall electrode structures of the present invention having nitride rich tantalum nitride thermal isolation between the more highly conductive TiN layer and the underlying bulk contact plug, can be on the order of 100 times more efficient than electrodes without such thermal isolation. Because of this improved power delivery efficiency, to generate a certain amount of power applied to an active region of a memory element, during a reset operation for example, the current required is much smaller with the thermally confined sidewall electrode structures of the present invention. The increase in power delivery efficiency is believed to be due at least to a large degree, to the effective thermal insulation by the nitride rich tantalum nitride layer from the underlying contact plug.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
an array of contacts having top surfaces;
an insulating layer over the array of contacts, the insulating layer including a trench having at least a first side-wall aligned over the top surfaces of a first plurality of contacts in the array;
a plurality of side-wall electrodes on the first side-wall of the trench contacting respective top surfaces of the contacts in the first plurality of contacts and having electrode top surfaces, the side-wall electrodes respectively comprising a layer of tantalum nitride, having a composition $Ta_xN_y$, where y is greater than x, and a layer of electrode material having a lower electrical resistivity and a lower thermal resistivity than the layer of tantalum nitride; and
a first element of memory material in direct contact with the electrode top surfaces of the plurality of side-wall electrodes.

2. The device of claim 1, wherein the layer of tantalum nitride is disposed between the layer of electrode material and the top surface of the corresponding contact.

3. The device of claim 1, including a second layer of tantalum nitride, wherein the first mentioned layer of tantalum nitride is disposed between the layer of electrode material and the top surface of the corresponding contact, and the second layer of tantalum nitride overlies the layer of electrode material.

4. The device of claim 1, wherein the layer of electrode material consists of titanium nitride.

5. The device of claim 1, wherein the memory material comprises a phase change material.

6. The phase change memory device of claim 1, wherein tantalum nitride $Ta_xN_y$ is at least one of $Ta_3N_5$ and $Ta_2N_3$.

7. The device of claim 1 wherein the layer of electrode material consists of one or more materials selected from a group including $Ta_xN_y$, having a lower electrical resistivity than said first mentioned layer of tantalum nitride, Ta, W, W-silicide, Pt, Ru, $RuO_2$, Ir, and $IrO_2$.

8. The device of claim 1, wherein the layer of tantalum nitride $Ta_xN_y$ is from 1 nanometer to 20 nanometers thick.

9. The device of claim 1, wherein the layer of electrode material consists of titanium nitride having thickness from 0.4 nanometers to 10 nanometers.

10. The device of claim 1, including an array of access devices coupled to the array of contacts.

11. The device of claim 1, wherein the trench has a second side-wall parallel with the first side-wall, and is aligned over the top surfaces of a second plurality of contacts in the array;
- a second plurality of side-wall electrodes on the second side-wall of the trench contacting respective top surfaces of the contacts in the second plurality of contacts and having electrode top surfaces, the side-wall electrodes respectively comprising a layer of tantalum nitride, having a composition $Ta_xN_y$, where y is greater than x, and a layer of electrode material having a lower electrical resistivity and a lower thermal resistivity than the layer of tantalum nitride; and
- a second element of memory material in direct contact with the electrode top surfaces of the second plurality of side-wall electrodes.

12. A method for constructing a memory device, comprising:
- forming an array of contacts having top surfaces on a substrate;
- forming a trench within a first insulating layer on the array of contacts, the trench having a side-wall aligned over the top surfaces of a plurality of contacts in the array of contacts;
- depositing electrode material over the insulating layer and on the side-wall of the trench, the electrode material including a layer of tantalum nitride, having a composition $Ta_xN_y$, where y is greater than x, and a layer of electrode material having a lower electrical resistivity and a lower thermal resistivity than the layer of tantalum nitride;
- depositing a second insulating spacer layer of insulating materials over the layers of materials;
- removing the electrode material and second insulating spacer layer in a center region of the trench and outside the trench while keeping the electrode material lining the sidewall of the trench and part of the top surfaces of the contacts;
- filling the trench with dielectric fill material to form a filled structure, and etching or polishing the filled structure to form a surface exposing a top edge of the electrode material;
- etching the electrode material in a pattern to form isolated side-wall electrodes contacting respective top surfaces of the contacts in the plurality of contacts and having electrode top surfaces; and
- forming elements of a memory material in direct contact with respective electrode top surfaces of the side-wall electrodes.

13. The method of claim 12, wherein the layer of tantalum nitride is disposed between the layer of electrode material and the top surface of the corresponding contact.

14. The method of claim 12, wherein the electrode material includes a second layer of tantalum nitride, wherein the first mentioned layer of tantalum nitride is disposed between the layer of electrode material and the top surface of the of the corresponding contact, and the second layer of tantalum nitride overlies the layer of electrode material.

15. The method of claim 12, wherein the electrode material is titanium nitride.

16. The method of claim 12, wherein the memory material comprises a phase change material.

17. The method of claim 12, wherein tantalum nitride $Ta_xN_y$ is at least one of $Ta_3N_5$ and $Ta_2N_3$.

18. The method of claim 12, wherein the electrode material consists of one or more materials selected from a group including $Ta_xN_y$, having a lower electrical resistivity that said first mention layer of tantalum nitride, Ta, W, W-silicide, Pt, Ru, $RuO_2$, Ir, and $IrO_2$.

19. The method of claim 12, wherein the layer of tantalum nitride $Ta_xN_y$ is from 1 nanometer to 20 nanometers thick.

20. The method of claim 12, wherein the electrode material is titanium nitride having a thickness from 0.4 nanometers to 10 nanometers.

21. The method of claim 12, including forming an array of access devices coupled to the array of contacts.

* * * * *

UNITED STATES PATENT AND TRADEMARK OFFICE
CERTIFICATE OF CORRECTION

PATENT NO. : 8,987,700 B2
APPLICATION NO. : 13/310583
DATED : March 24, 2015
INVENTOR(S) : Sheng-Chih Lai et al.

It is certified that error appears in the above-identified patent and that said Letters Patent is hereby corrected as shown below:

On the title page item 73 should read

MACRONIX INTERNATIONAL CO., LTD
INTERNATIONAL BUSINESS MACHINES CORPORATION

Signed and Sealed this
Second Day of June, 2015

Michelle K. Lee
*Director of the United States Patent and Trademark Office*